(12) United States Patent
Skinner et al.

(10) Patent No.: US 8,769,213 B2
(45) Date of Patent: Jul. 1, 2014

(54) MULTI-PORT MEMORY AND OPERATION

(75) Inventors: Dan Skinner, Boise, ID (US); J. Thomas Pawlowski, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1346 days.

(21) Appl. No.: 12/546,258

(22) Filed: Aug. 24, 2009

(65) Prior Publication Data

US 2011/0047311 A1 Feb. 24, 2011

(51) Int. Cl.
*G06F 13/00* (2006.01)
*G06F 13/28* (2006.01)

(52) U.S. Cl.
USPC ............... 711/149; 711/147; 711/E12.048

(58) Field of Classification Search
None
See application file for complete search history.

(56) References Cited

U.S. PATENT DOCUMENTS

| 7,421,559 B1 | 9/2008 | Yadav |
| 7,949,863 B2 * | 5/2011 | Ruberg et al. ............... 712/244 |
| 2002/0087751 A1 | 7/2002 | Chong, Jr. |
| 2005/0047255 A1 * | 3/2005 | Park et al. ............. 365/230.05 |
| 2009/0175114 A1 | 7/2009 | Kim et al. |
| 2009/0276545 A1 | 11/2009 | Lee et al. |

FOREIGN PATENT DOCUMENTS

| JP | 07-160655 | * | 6/1995 | ........... G06F 15/163 |
| KR | 10-2007-0035209 A | | 3/2007 | |
| KR | 10-2007-0113493 A | | 11/2007 | |

* cited by examiner

*Primary Examiner* — Eric S Cardwell
(74) *Attorney, Agent, or Firm* — Dicke, Billig & Czaja, PLLC

(57) ABSTRACT

Multi-port memory having an additional control bus for passing commands between ports have individual ports that can be configured to respond to a command received from an external control bus or to a command received from the additional control bus. This facilitates various combinations of ports to vary the bandwidth or latency of the memory to facilitate tailoring performance characteristics to differing applications.

36 Claims, 7 Drawing Sheets

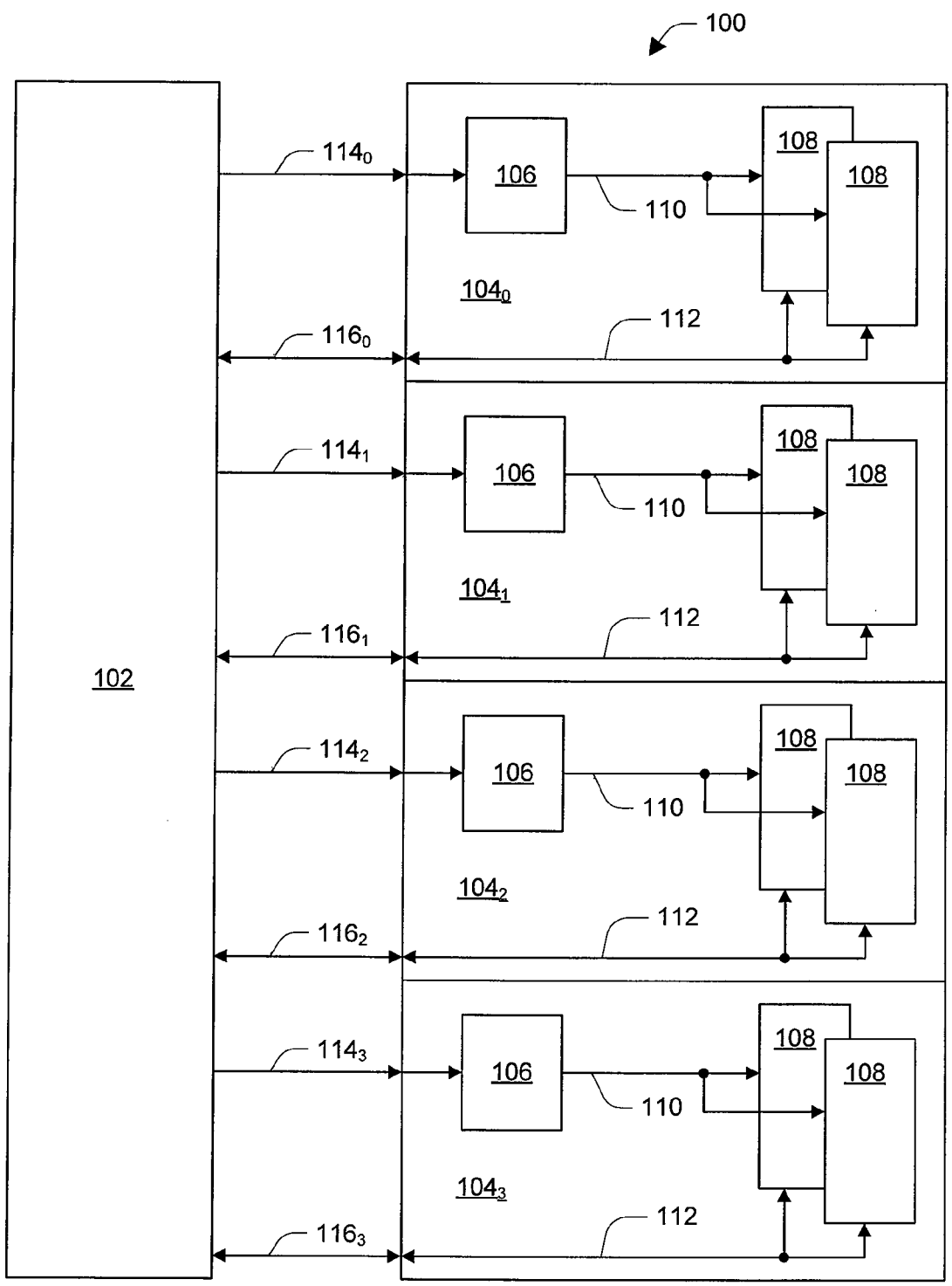
FIG. 1 (*prior art*)

MULTI-PORT MEMORY AND OPERATION

TECHNICAL FIELD

The present disclosure relates generally to semiconductor memory, and in particular, in one or more embodiments, the present disclosure relates to multi-port memory and its operation.

BACKGROUND

A multi-port memory is a memory with one or more independent physical or logical interfaces that control regions, e.g., sub-portions or banks, of the memory. Each physical interface includes a control mechanism, e.g., a control bus, for receiving command and address signals, and a data bus, for communicating data signals, that control the memory operation and transport data to and from the memory. Multi-port memory are of interest due to their ability to reduce power and latency of memory operation by being able to independently control separate regions of the memory.

Nonvolatile memory is an important form of semiconductor memory. Non-volatile memory generally holds its data values for some extended period without the application of power. Flash memory devices are one particular class of non-volatile memory that have developed into a popular source of memory for a wide range of electronic applications. Flash memory devices typically use a one-transistor memory cell that allows for high memory densities, high reliability, and low power consumption. Changes in threshold voltage of the cells, through programming of a charge storage node, (e.g., a floating gate or charge trap), or other physical phenomena(e.g., phase change or polarization), determine the data value of each cell. By defining two or more ranges of threshold voltages to correspond to individual data values, one or more bits of information may be stored on each cell.

Another important form of semiconductor memory includes volatile memory, such as dynamic random access memory (DRAM). Volatile memory is often used where rapid access to the memory array is desired for both data input and data output. Volatile memory, such as DRAM, generally has faster access times many non-volatile memories, but requires periodic refresh to avoid losing its data values.

Common uses for semiconductor memory include personal computers, personal digital assistants (PDAs), digital cameras, digital media players, digital recorders, games, appliances, vehicles, wireless devices, mobile telephones and removable memory modules, and the uses for non-volatile memory continue to expand. As the applications and demands for memory expand, flexibility becomes more desirable.

For the reasons stated above, and for other reasons which will become apparent to those skilled in the art upon reading and understanding the present specification, there is a need in the art for alternative multi-port memories and their operation.

BRIEF DESCRIPTION OF THE DRAWINGS

FIG. 1 is a simplified block diagram of a prior-art multi-port memory coupled to a processor as part of an electronic system.

DETAILED DESCRIPTION

Figure 2A:
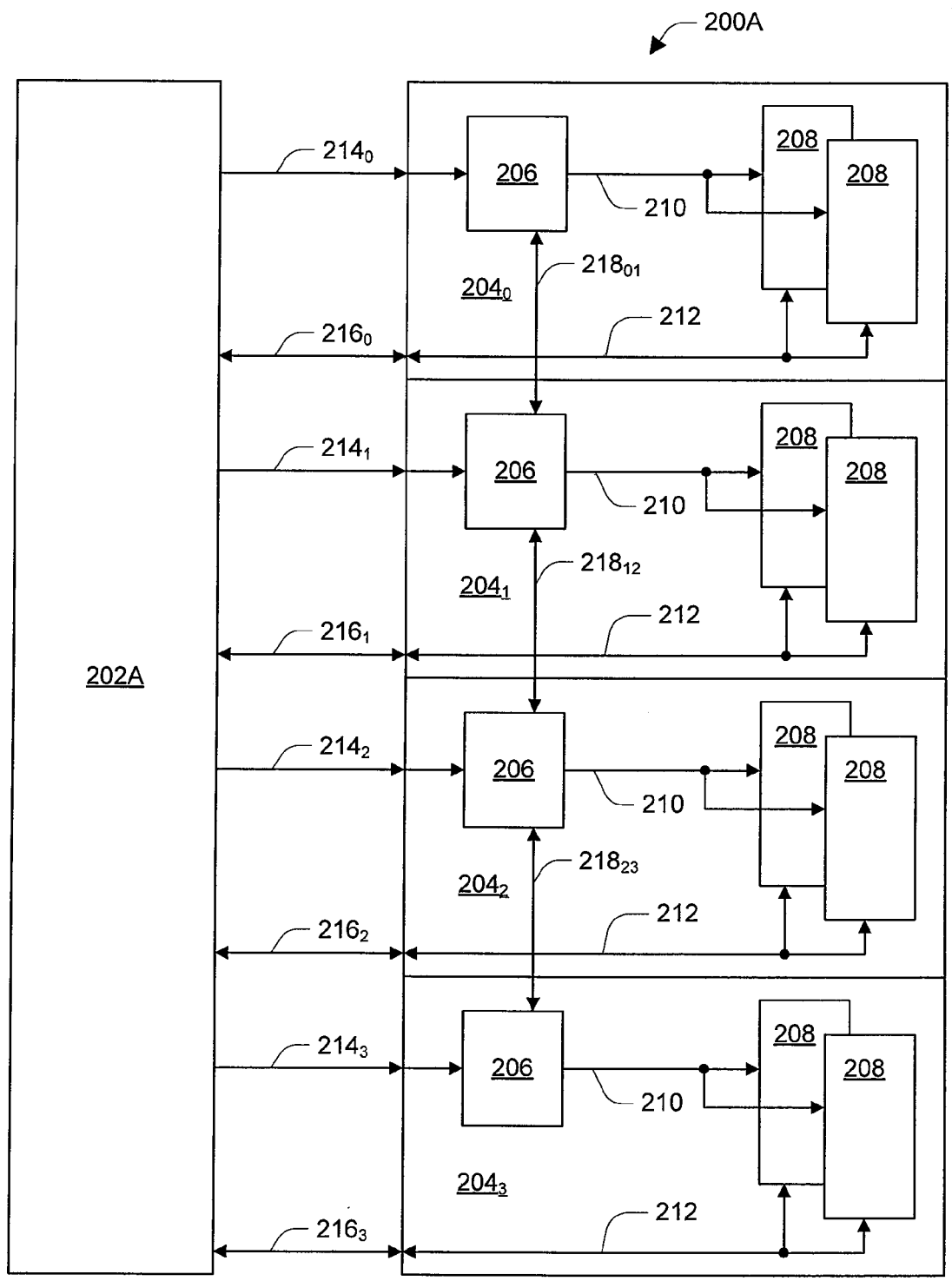
FIGS. 2A-2E are each a simplified block diagram of a multi-port memory coupled to a processor as part of an electronic system, according to embodiments of the disclosure.

In the following detailed description of the present embodiments, reference is made to the accompanying drawings that form a part hereof, and in which is shown by way of illustration specific embodiments in which the embodiments may be practiced. These embodiments are described in sufficient detail to enable those skilled in the art to practice the invention, and it is to be understood that other embodiments may be utilized and that process, electrical or mechanical changes may be made without departing from the scope of the present disclosure. The following detailed description is, therefore, not to be taken in a limiting sense.

FIG. 1 is a simplified block diagram of a prior-art multi-port memory 100 in communication with (e.g., coupled to) a processor 102 as part of an electronic system. Some examples of electronic systems include personal computers, personal digital assistants (PDAs), digital cameras, digital media players, digital recorders, games, appliances, vehicles, wireless devices, cellular telephones and the like. The processor 102 may be a memory controller or other external processor.

Memory 100 includes two or more ports 104. For this example, four ports $104_0$-$104_3$ are depicted. Each port 104 is configured to receive a corresponding external control bus 114 and external data bus 116. Although depicted as a single processor, processor 102 could be represented by two or more processors, each coupled to one or more of the ports 104. Similarly, each processor 102 could be in communication with more than one memory 100. The ports 104 of memory 100 receive commands (in the form of command signals) and addresses (in the form of address signals) across their respective external control bus 114. The external control bus 114 may include one or more lanes for receiving commands and addresses either in serial or parallel fashion.

The ports 104 of memory 100 send or receive data (in the form of data signals) across their respective external data bus 116. The external data bus 116 may include one or more lanes for sending or receiving data either in serial or parallel fashion. Each lane, whether the external control bus 114 or the external data bus 116, carries a single value. For example, a 32-bit command could be carried in parallel to the memory 100 on an external control bus 114 having 32 lanes. As another example, a 128-bit data word could be carried in parallel to or from the memory 100 on an external data bus 116 having 128 lanes. A lane may represent one or more physical connections. For example, using single-ended communication, a lane could be presented as a single physical connection while using differential communication, a lane could be presented as two physical connections with one carrying the desired value and the other carrying a complement of the desired value.

Each port 104 includes control circuitry 106. Control circuitry 106 controls access to one or more regions of memory 108 of its port 104 in response to the commands and addresses received at its external control bus 114. For example, regions of memory 108 could represent banks of memory cells. The regions of memory 108 could include volatile or non-volatile memory cells. An internal control bus 110 is coupled between the control circuitry 106 and its regions of memory 108 to communicate commands to its regions of memory 108 from the control circuitry 106. An internal data bus 112 is coupled between its regions of memory 108 and the external data bus 116 to communicate data between its regions of memory 108 and its external data bus 116.

Embodiments of the disclosure are distinct from the multi-port memory of FIG. 1 in that an additional control bus, referred to herein as an interport control bus, is included to pass commands (and associated addresses, if applicable) received at one port to one or more additional ports. Such multi-port memory have individual ports that can be configured to respond to a command received from an external control bus, i.e., from an external device, or to a command received from an interport control bus, i.e., from another port. This facilitates various combinations of ports to vary the bandwidth or latency of the memory to permit tailoring the performance characteristics of the memory to differing applications. Using a 4-port memory having a 128-bit internal data bus as an example, by selectively configuring the control circuitry of a port to be responsive to either a command received from an external control bus or to a command received from an interport control bus, this memory could appear as a four-port memory each having a 128-bit internal data bus, a two-port memory each having a 256-bit internal data bus, a single-port memory having a 512-bit internal data bus, and more. In this manner, a single fabricated part could be used in a variety of applications having differing performance requirements.

FIGS. 2A-2E are each a simplified block diagram of a multi-port memory 200 coupled to a processor 202 as part of an electronic system, according to embodiments of the disclosure. Some examples of electronic systems include personal computers, personal digital assistants (PDAs), digital cameras, digital media players, digital recorders, games, appliances, vehicles, wireless devices, cellular telephones and the like. The processor 202 may be a memory controller or other external processor.

FIGS. 2A-2E share many common features. Each memory 200 includes two or more ports 204. For these examples, four ports $204_0$-$204_3$ are depicted. However, fewer or additional ports 204 could be included in various embodiments. Each port 204 is configured to receive a corresponding external control bus 214 and external data bus 216 from processor 202, although certain embodiments do not make use of one or more control buses 214 when coupled to a processor 202. That is, although each port 204 could be coupled to an external control bus 214, it need not. Although depicted as a single processor, processor 202 could be represented by two or more processors, each coupled to one or more of the ports 204. Similarly, the processor 202 could be coupled to more than one memory 200.

The ports 204 of memory 200 receive commands (in the form of command signals) and addresses (in the form of address signals) across their respective external control bus 214, i.e., from an external device. The external control bus 214 may include one or more lanes for receiving commands and addresses either in serial or parallel fashion. The ports 204 of memory 200 send or receive data (in the form of data signals) across their respective external data bus 216. The external data bus 216 may include one or more lanes for sending or receiving data either in serial or parallel fashion. Each lane, whether the external control bus 214 or the external data bus 216, carries a single value. For example, a 32-bit command could be carried in parallel to the memory 200 on an external control bus 214 having 32 lanes. As another example, a 128-bit data word could be carried in parallel to or from the memory 200 on an external data bus 216 having 128 lanes. As a further example, a 32-bit command could be carried in serial to the memory 200 on a single lane of the external control bus 214, with one value of the command arriving for each time interval of some serial protocol, and taking 32 such time intervals to receive the full command. A lane may represent one or more physical connections. For example, using single-ended communication, a lane could be presented as a single physical connection while using differential communication, a lane could be presented as two physical connections with one carrying the desired value and the other carrying a complement of the desired value.

Each port 204 includes control circuitry 206. Control circuitry 206 controls access to one or more regions of memory 208 of its port 204 in response to the commands (including addresses, if appropriate to the command) received at its external control bus 214. For example, regions of memory 208 could represent banks of memory cells. The regions of memory 208 could include volatile or non-volatile memory cells, and could include a variety of architectures. The nature and architecture of the memory is not critical to the disclosure as each may be operated as described herein. Although two regions of memory 208 are depicted for each port 204, fewer or additional regions of memory 208 could be used. An internal control bus 210 is coupled between the control circuitry 206 and its regions of memory 208 to communicate commands to its regions of memory 208 from the control circuitry 206. An internal data bus 212 is coupled between its regions of memory 208 and the external data bus 216 to communicate data between its regions of memory 208 and its external data bus 216, i.e., to communicate data values to or from an external device.

Although regions of memory 208 are depicted to be physically located in their port 204 in FIGS. 2A-2E, their physical location within memory 200 is not critical. As used herein, a region of memory 208 is a component of a port 204 if its access is controlled by the control circuitry 206 of that port 204 and its data I/O is coupled to the internal data bus 212 of that port 204.

Each memory 200 further includes at least one interport control bus 218 coupled between control circuitry 206 of at least two of the ports 204. Each interport control bus 218 is configured to allow command signals received at the control circuitry 206 of one port 204 to be passed to the control circuitry 206 of one or more other ports 204. It is noted that where the command is associated with an address to point to one or more target regions of memory or some portion of those regions of memory, e.g., a read command or a write command, passing a command, as used herein, will denote also passing the associated address as they are deemed to be part of the command. Each control circuitry 206 coupled to an interport control bus 218 and configured to receive commands from an external control bus 214 is further configured to select which control bus to respond to. For example, a register, fuse, anti-fuse, bond wire option, manufacturing metal layer or other control mechanism could be set, either during fabrication (hard programmed) or through user command (dynamic), to indicate whether the control circuitry 206 will respond to commands received from an external control bus 214 or an interport control bus 218. For example, a one-bit register could indicate whether to respond to commands received from an external control bus 214 or an interport control bus 218. For a further example, if a control circuitry 206 is coupled to two interport control buses, a two-bit register could indicate whether to respond to commands received from an external control bus 214, a first interport control bus 218 or a second interport control bus 218. In this manner, the number of ports 204 of a memory 200 can be selected based on the application for which it is intended.

For certain embodiments, each control circuitry 206 coupled to an interport control bus 218 and configured to receive commands from an external control bus 214 is further configured to select whether to forward the commands received from its external control bus 214 to one of the interport control buses 218. Again, a register, fuse, anti-fuse, bond wire option, manufacturing metal layer or other control mechanism could be set, either during fabrication or through user command, to indicate whether the control circuitry 206 will drive one or more of the interport control buses 218. For example, if a control circuitry 206 is coupled to two interport control buses 218, a two-bit register could indicate whether to forward its command to a first interport control bus 218, to a second interport control bus 218 or to neither interport control bus 218. As will be described below in more detail, various embodiments of memory 200 having N ports 204 could be operated as if they were a memory having between 1 and N ports 204 by selecting whether a control circuitry 206 responds to an external control bus 214 or an interport control bus 218.

FIG. 2A is a simplified block diagram of a memory 200A coupled to a processor 202A in accordance with an embodiment of the disclosure. In the embodiment of FIG. 2A, an interport control bus 218 is coupled between each control circuitry 206. For example, an interport control bus 218 is coupled to the control circuitry 206 of each pair of ports $204_0/204_1$, $204_1/204_2$ and $204_2/204_3$. This example embodiment depicts an external control bus 214 and an external data bus 216 from processor 202A coupled to each port 204. Such an embodiment can provide a variety of configurations where the control circuitry 206 of the ports 204 can be selectively configured to respond to and drive their interport control buses 218, e.g., through the programming of one or more resettable registers or other control mechanism. For example, the memory 200A, assuming four ports 204 and n-bit external data buses 216 for the example, could be configured to mimic a one-port memory outputting a 4n-bit data word; a two-port memory outputting two 2n-bit data words or an n-bit data word and a 3n-bit data word; a three-port memory outputting a 2n-bit data word and two n-bit data words; or a four-port memory outputting four n-bit data words.

Figure 2B:
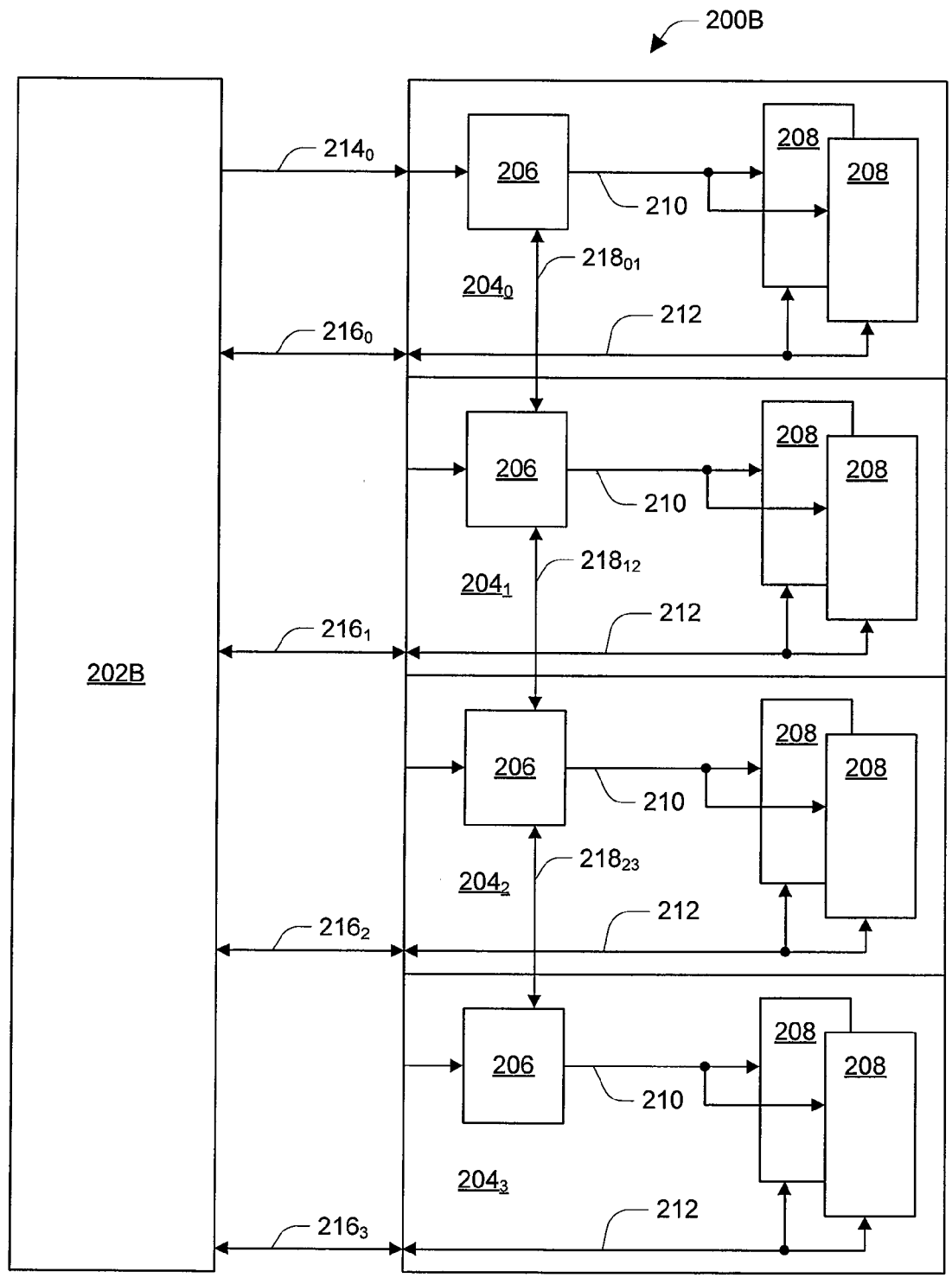

As one example, the memory 200A of FIG. 2A could be configured to exhibit the behavior of the memory 200B of FIG. 2B by configuring the control circuitry 206 of port $204_0$ to respond to commands received from external control bus $214_0$ and to pass those commands to interport control bus $218_{01}$. The control circuitry 206 of port $204_1$ would be configured to respond to commands received from the interport control bus $218_{01}$ and to pass those commands to interport control bus $218_{12}$. The control circuitry 206 of port $204_2$ would be configured to respond to commands received from the interport control bus $218_{12}$ and to pass those commands to interport control bus $218_{23}$. The control circuitry 206 of port $204_3$ would be configured to respond to commands received from the interport control bus $218_{23}$. Each port 204 provides its data output, and receives its data input, through its respective external data bus 216 in parallel.

Figure 2C:
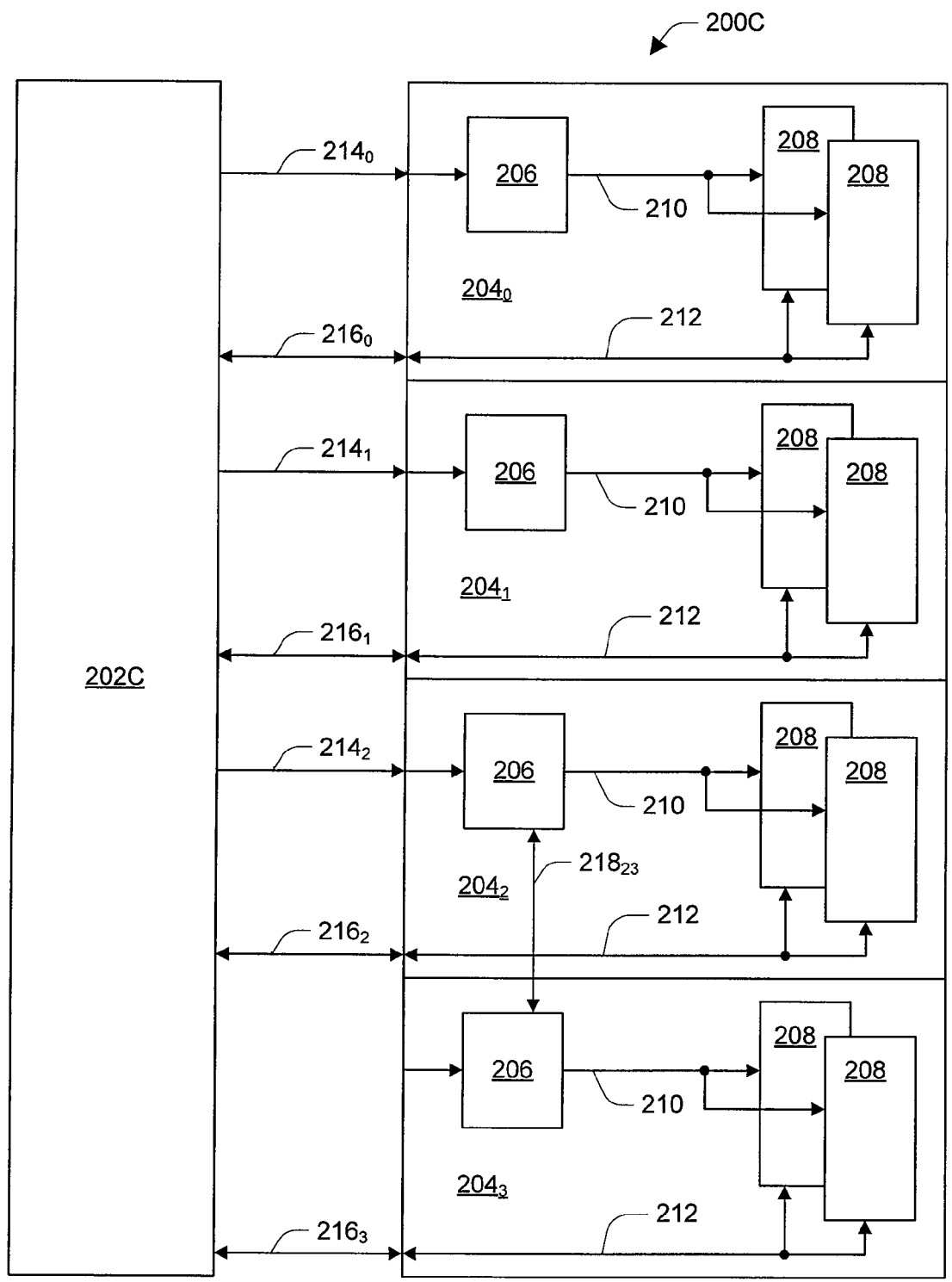

As another example, the memory 200A of FIG. 2A could be configured to exhibit the behavior of the memory 200C of FIG. 2C by configuring the control circuitry 206 of port $204_0$ to respond to commands received from external control bus $214_0$ without passing those commands to interport control bus $218_{01}$. The control circuitry 206 of port $204_1$ would be configured to respond to commands received from the external control bus $214_1$ without passing those commands to interport control bus $218_{12}$. The control circuitry 206 of port $204_2$ would be configured to respond to commands received from the external control bus $214_2$ and to pass those commands to interport control bus $218_{23}$. The control circuitry 206 of port $204_3$ would be configured to respond to commands received from the interport control bus $218_{23}$. Each port $204_2$ and port $204_3$ provides its data output, and receives its data input, through its respective external data bus 216 in parallel. Other configurations could be envisioned using such examples as a guide.

FIG. 2B is a simplified block diagram of a memory 200B coupled to a processor 202B in accordance with an embodiment of the disclosure. In the embodiment of FIG. 2B, an interport control bus 218 is coupled between pairs of control circuitry 206. This example embodiment depicts an external data bus 216 from processor 202B coupled to each port 204, but a single external control bus $214_0$ coupled only to port $204_0$. The control circuitry 206 of port $204_0$ is configured to respond to commands received from external control bus $214_0$ and to pass those commands to interport control bus $218_{01}$. The control circuitry 206 of port $204_1$ is configured to respond to commands received from the interport control bus $218_{01}$ and to pass those commands to interport control bus $218_{12}$. The control circuitry 206 of port $204_2$ is configured to respond to commands received from the interport control bus $218_{12}$ and to pass those commands to interport control bus $218_{23}$. The control circuitry 206 of port $204_3$ is configured to respond to commands received from the interport control bus $218_{23}$. Each port 204 provides its data output, and receives its data input, through its respective external data bus 216 in parallel. Such an embodiment, assuming four ports 204 and n-bit external data buses 216 for the example, mimics the behavior of a one-port memory outputting a 4n-bit data word, i.e., a 4-wide port.

Figure 2D:
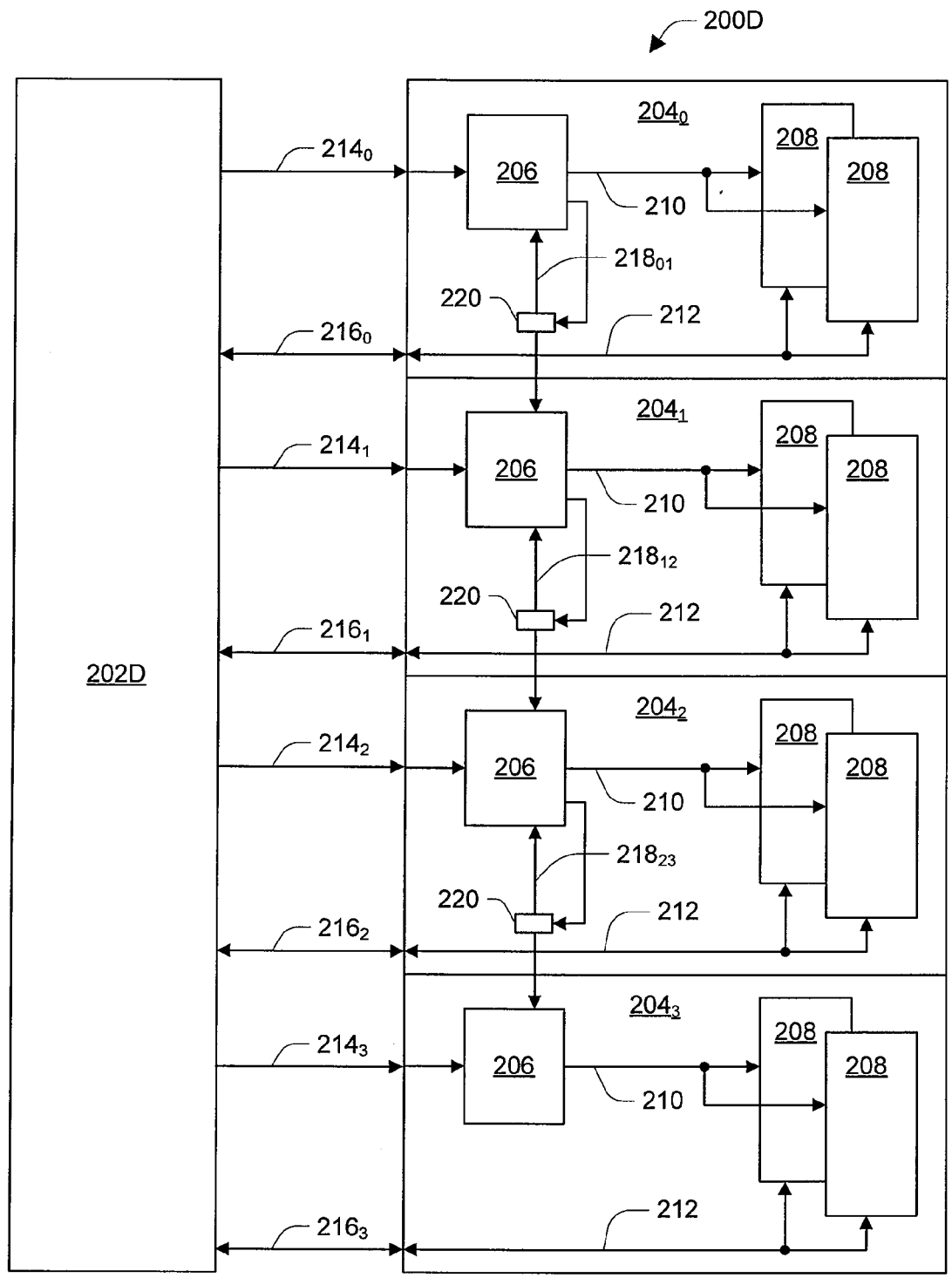
Figure 2E:
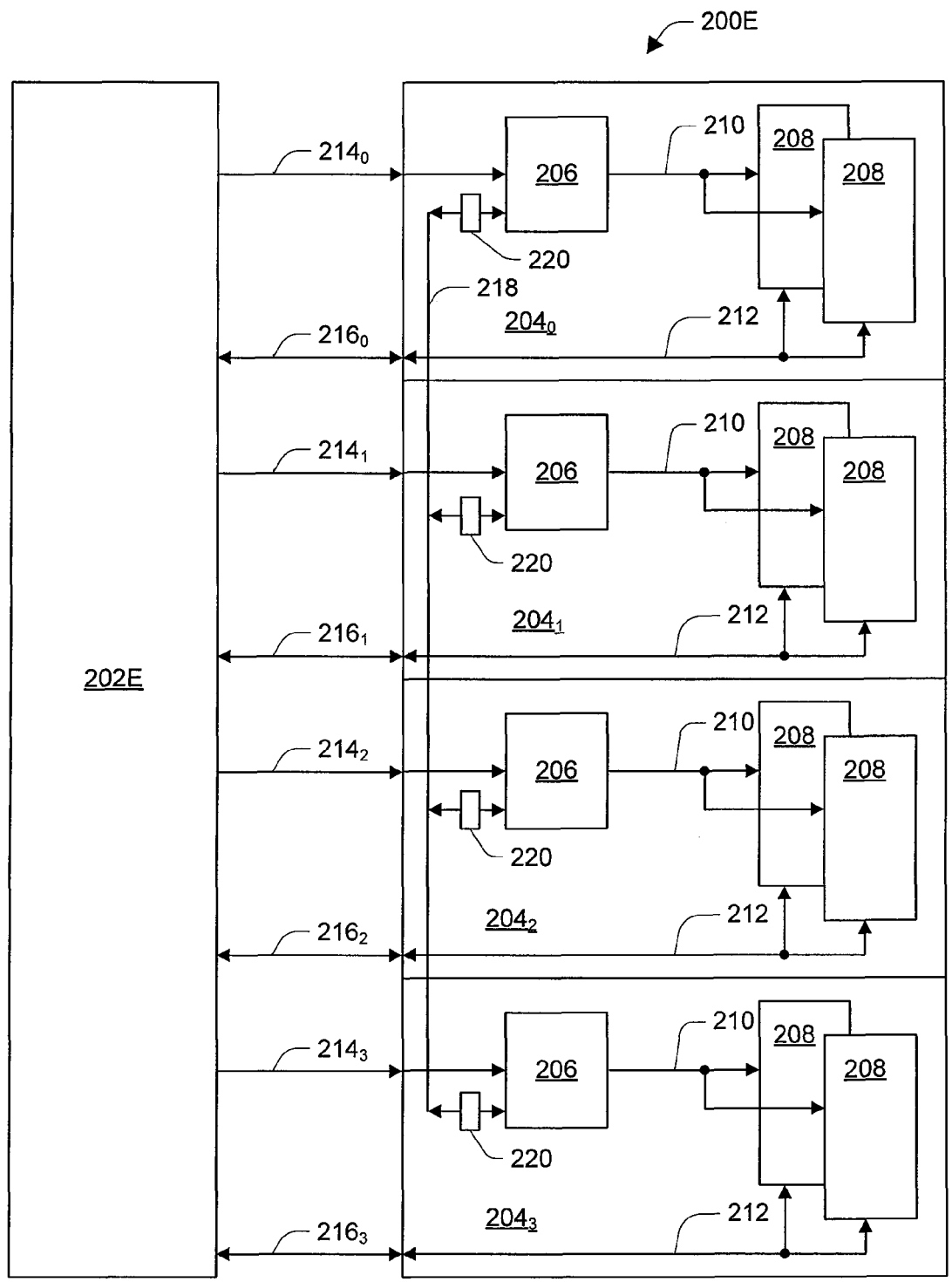

For a further embodiment, the interport control buses $218_{01}$, $218_{12}$ and $218_{23}$ could be replaced by a single interport control bus 218 coupled to each control circuitry 206 (see, e.g., interport control bus 218 of FIG. 2E, without the switches 220). In this embodiment, there would be no need to configure the control circuitry 206 of ports $204_1$-$204_3$ to forward their commands. For example, each control circuitry 206 could be configured to only forward a received command if the command were received from an external control bus 214.

FIG. 2C is a simplified block diagram of a memory 200C coupled to a processor 202C in accordance with an embodiment of the disclosure. In the embodiment of FIG. 2C, an interport control bus 218 is coupled between the control circuitry 206 only for ports $204_2$ and $204_3$. Thus, the one or more interport control buses 218 may be coupled to control circuitry 206 of less than all of the ports 204 of a memory 200. This example embodiment depicts an external data bus 216 from processor 202C coupled to each port 204, but an external control bus 214 coupled only to ports $204_0$-$204_2$. The control circuitry 206 of port $204_0$ is configured as an independent port to respond to commands received from the external control bus $214_0$. The control circuitry 206 of port $204_1$ is configured as an independent port to respond to commands received from the external control bus $214_1$. The control circuitry 206 of port $204_2$ is configured to respond to commands received from the external control bus $214_2$ and to pass those commands to interport control bus $218_{23}$. The control circuitry 206 of port $204_3$ is configured to respond to commands received from the interport control bus $218_{23}$ such that ports $204_2$ and $204_3$ act as a single 2-wide port. Each port $204_2$ and $204_3$ provides its data output, and receives its data input, through its respective external data bus 216 in parallel. Such an embodiment, assuming four ports 204 and n-bit external data buses 216 for the example, mimics the behavior of a three-port memory outputting a 2n-bit data word and two n-bit data words.

FIG. 2D is a simplified block diagram of a memory 200D coupled to a processor 202D in accordance with an embodiment of the disclosure. In the embodiment of FIG. 2D, an interport control bus 218 is coupled between each control circuitry 206. Although similar to the embodiment of FIG. 2A, in this embodiment, one or more of the interport control buses 218 includes a switch 220 responsive to a control circuitry 206 to selectively block communication across that interport control bus 218 and to selectively isolate a control circuitry 206 from a neighboring control circuitry 206. This example embodiment depicts an external control bus 214 and an external data bus 216 from processor 202D coupled to each port 204. Similar to the embodiment of FIG. 2A, this embodiment can provide a variety of configurations where the control circuitry 206 of the ports 204 can be selectively configured to respond to, drive and isolate their interport control buses 218, e.g., through the programming of one or more resettable registers or other control mechanism. For example, a configuration to mimic two 2-wide ports could be accomplished by activating switches $218_{01}$ and $218_{23}$, deactivating switch $218_{12}$, configuring the ports $204_0$ and $204_1$ to respond to commands received from either external control bus $214_0$ or $214_1$, and configuring ports $204_2$ and $204_3$ to respond to commands received from either external control bus $214_2$ or $214_3$. Each switch 220 is configured to pass command values on each lane of its interport control bus 218 when activated, or to block command values on each lane of its interport control bus 218 when deactivated.

FIG. 2E is a simplified block diagram of a memory 200E coupled to a processor 202E in accordance with an embodiment of the disclosure. In the embodiment of FIG. 2E, a single interport control bus 218 is coupled to each control circuitry 206. Furthermore, in this embodiment, each control circuitry 206 is selectively isolated from the interport control bus 218 using a switch 220 responsive to control signals from its respective control circuitry 206 to selectively block communication between the interport control bus 218 the respective control circuitry 206 and to selectively isolate a control circuitry 206 from each remaining control circuitry 206. Each switch 220 is configured to pass command values on each lane of its interport control bus 218 when activated, or to block command values on each lane of its interport control bus 218 when deactivated. This example embodiment depicts an external control bus 214 and an external data bus 216 from processor 202E coupled to each port 204. Such an embodiment can provide a variety of configurations where the control circuitry 206 of the ports 204 can be selectively configured to respond to and drive the interport control bus 218, and can be selectively isolated from the interport control bus 218, e.g., through the programming of one or more resettable registers or other control mechanism. For example, the memory 200E, assuming four ports 204 and n-bit external data buses 216 for the example, could be configured to mimic a one-port memory outputting a 4n-bit data word; a two-port memory outputting two 2n-bit data words or an n-bit data word and a 3n-bit data word; a three-port memory outputting a 2n-bit data word and two n-bit data words; or a four-port memory outputting four n-bit data words. Note that while neighboring ports 204 were combined to act as a single port in preceding embodiments, the embodiment of FIG. 2E facilitates the combining of ports 204 that are not immediate neighbors. For example, if switches 220 of ports $204_0$ and $204_2$ were deactivated, ports $204_1$ and $204_3$ could be combined, i.e., configured to respond to commands from a single external control bus 214 while ports $204_0$ and $204_2$ could be configured as independent ports.

Figure 3:
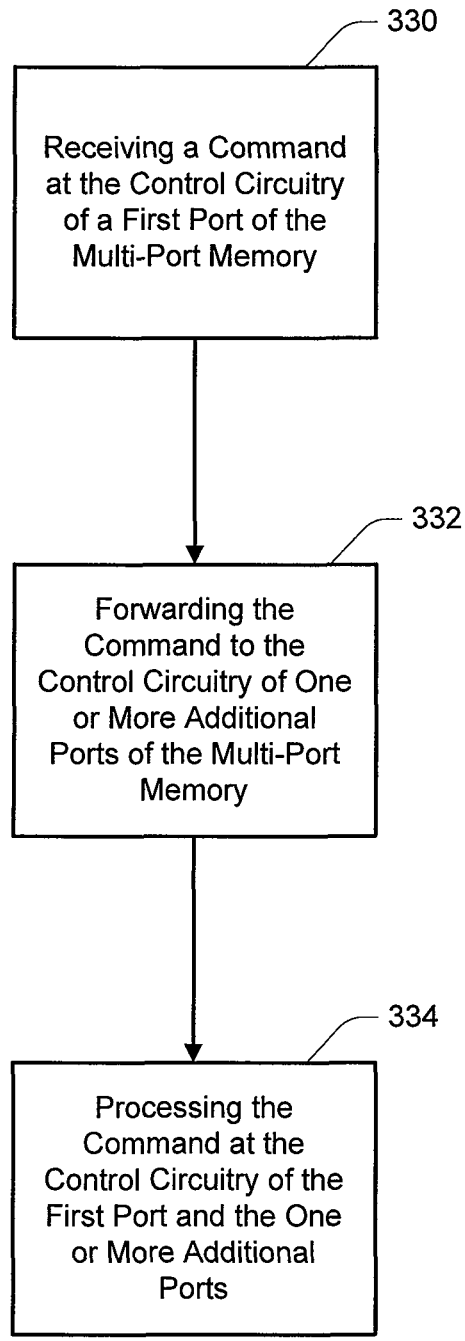
FIG. 3 is a flowchart of a method of operating a multi-port memory, according to an embodiment of the disclosure.

FIG. 3 is a flowchart of a method of operating a multi-port memory, according to an embodiment of the disclosure. The method includes receiving a command at the control circuitry of a first port of the multi-port memory at box 330. For example, a command could be received at the control circuitry 206 of port $204_0$ of a multi-port memory 200 from a processor 202 on external control bus $214_0$. The command could be, for example, a read command, for retrieving data values from one or more regions of memory 208 of the memory 200, or a write command, for writing data values to one or more regions of memory 208 of the memory 200. The command includes address signals for addressing a target portion of each region of memory 208. The command may further include address signals for addressing a specific port of the multi-port memory 200.

The method further includes forwarding the command to the control circuitry of one or more additional ports of the multi-port memory at box 332. For example, the control circuitry 206 of port $204_0$ may forward the command to the control circuitry 206 of neighboring port $204_1$ or to the control circuitry 206 of one or more alternative or additional ports 204. The command may be passed to a single interport control bus 218 coupled to each control circuitry 206 receiving the command. Alternatively, the command may be cascaded through the control circuitry 206 of one port 204 to the control circuitry 206 of successive ports 204. One or more ports 204 may either ignore the command or be isolated therefrom.

The method still further includes processing the command at the control circuitry of the first port and the one or more additional ports at box 334. For a read command, data values are retrieved from the target portion of the one or more regions of memory 208 and provided to an internal data bus 212 for output from the memory 200 to an external device, e.g., a processor 202. For a write command, data values provided to the internal data bus 212 from an external device, e.g., a processor 202, are written to the target portion of the one or more regions of memory 208. Processing the command may further include ignoring the command if the address associated with the command does not match an address of a region of memory 208 of the port 204 receiving the command.

Although a variety of embodiments have been described, other configurations will be apparent in view of the foregoing embodiments. In addition, although certain embodiments included connections to external control buses 214 that were unnecessary, i.e., where a port 204 was connected to an external control bus 214 even though its control circuitry 206 could be configured to ignore the external control bus 214, unnecessary connections may be eliminated. Similarly, where no connection to an external control bus 214 was depicted for a port 204 because its control circuitry 206 was configured to ignore the external control bus 214, an external control bus 214 could be coupled to each port. This might be desirable, for example, where the configuration of a control circuitry 206 can be performed through user command, thus allowing the configuration to be changed during use. In general, higher numbers of combined ports 204 increases the size of the data word, input or output, thus improving bandwidth corresponding to a single command. Similarly, lower numbers of combined ports 204, including independent ports 204, decreases the size of the data word, but improves latency as more parallel processing can be performed.

In addition, although the foregoing embodiments contemplated parallel operation of combined ports 204, a port address could be added to the command protocol such that a port 204 would only respond to a command, whether received from an external control bus 214 or an interport control bus 218, if the port address matched the address of that port 204.

Although specific embodiments have been illustrated and described herein, it will be appreciated by those of ordinary skill in the art that any arrangement that is calculated to achieve the same purpose may be substituted for the specific embodiments shown. Many adaptations of the disclosure will be apparent to those of ordinary skill in the art. Accordingly, this application is intended to cover any adaptations or variations of the disclosure.

What is claimed is:

1. A memory, comprising:
    two or more ports, each port comprising one or more regions of memory and control circuitry for controlling access to the one or more regions of memory in response to commands; and
    at least one interport control bus for communicating commands between the control circuitry of two of more of the ports;
    wherein the control circuitry of a first port of the two or more ports is configured to select whether to respond to commands received from either a first external control bus that is different than the at least one interport control bus or the at least one interport control bus; and
    wherein the control circuitry of a second port of the two or more ports is configured to select whether to respond to commands received from either a second external control bus that is different than the at least one interport control bus and the first external control bus or the at least one interport control bus.

2. The memory of claim 1, wherein the one or more regions of memory comprise banks of memory cells selected from the group consisting of volatile and non-volatile memory cells.

3. The memory of claim 1, wherein the control circuitry of each port of the two or more ports is separate from the control circuitry of the other ports of the two or more ports.

4. A memory, comprising:
    two or more ports, each port comprising one or more regions of memory and control circuitry for controlling access to the one or more regions of memory in response to commands; and
    at least one interport control bus for communicating commands between the control circuitry of two of more of the ports;
    wherein the control circuitry of at least one of the ports is configured to selectively respond to commands received from either an external control bus or an interport control bus; and
    wherein less than all of the ports are coupled to an interport control bus.

5. The memory of claim 4, wherein the control circuitry of each of the ports is configured to selectively respond to commands received from either an external control bus or an interport control bus.

6. A memory, comprising:
    two or more ports, each port comprising one or more regions of memory and control circuitry for controlling access to the one or more regions of memory in response to commands;
    at least one interport control bus for communicating commands between the control circuitry of two of more of the ports; and
    at least one switch for isolating at least one of the interport control buses;
    wherein the control circuitry of at least one of the ports is configured to selectively respond to commands received from either an external control bus or an interport control bus.

7. A memory, comprising:
    two or more ports, each port comprising one or more regions of memory and control circuitry for controlling access to the one or more regions of memory in response to commands; and
    at least one interport control bus for communicating commands between the control circuitry of two of more of the ports;
    wherein the control circuitry of at least one of the ports is configured to selectively respond to commands received from either an external control bus or an interport control bus; and
    wherein at least one port is not coupled to an interport control bus.

8. A memory, comprising:
    two or more ports, each port comprising one or more regions of memory and control circuitry for controlling access to the one or more regions of memory in response to commands; and
    an interport control bus coupled between the control circuitry of at least one pair of ports;
    wherein the control circuitry of a first port of the at least one pair of ports is configured to select whether to respond to commands received from either a first external control bus that is different than the interport control bus or the interport control bus; and
    wherein the control circuitry of a second port of the at least one pair of ports is configured to select whether to respond to commands received from either a second external control bus that is different than the interport control bus and the first external bus or the interport control bus.

9. The memory of claim 8, wherein another interport control bus is coupled between the control circuitry of at least one other pair of ports.

10. A memory, comprising:
    two or more ports, each port comprising one or more regions of memory and control circuitry for controlling access to the one or more regions of memory in response to commands; and
    an interport control bus coupled between the control circuitry of at least one pair of ports;
    wherein the control circuitry of at least one of the ports is configured to selectively respond to commands received from either an external device or an interport control bus; and
    wherein the control circuitry of at least one port is not coupled to an interport control bus.

11. The memory of claim 10, wherein the control circuitry of at least one of the ports is configured to selectively respond to commands received from either an external device, a first interport control bus coupled thereto or a second interport control bus coupled thereto.

12. A memory, comprising:
    two or more ports, each port comprising one or more regions of memory and control circuitry for controlling access to the one or more regions of memory in response to commands; and
    an interport control bus for communicating commands between the control circuitry of each of the two or more ports;
    wherein different ones of two or more external control busses are respectively coupled to the two or more ports, the two or more external control busses being different than the interport control bus;
    wherein the control circuitry of each of the two or more ports is configured to select whether to respond to commands received from either the one external control bus coupled to that port or the interport control bus.

13. The memory of claim 12, wherein the control circuitry of each of the ports is configured to selectively pass a command received from the one external control bus coupled to that port to the interport control bus.

14. The memory of claim 12, wherein the control circuitry of each of the ports is hard programmed to respond to commands received from either the one external control bus coupled to that port or the interport control bus.

15. The memory of claim 14, wherein the control circuitry of each of the ports is hard programmed using a control mechanism selected from the group consisting of fuses, antifuses, bond wire option and manufacturing metal layer.

16. The memory of claim 12, wherein the control circuitry of each of the ports is dynamically configured to select whether to respond to commands received from either the one external control bus coupled to that port or the interport control bus.

17. A memory, comprising:
two or more ports, each port comprising one or more regions of memory and control circuitry for controlling access to the one or more regions of memory in response to commands; and
an interport control bus for communicating commands between the control circuitry of each of the two or more ports; and
a switch coupled between the interport control bus and the control circuitry of each of the two or more ports to selectively isolate each control circuitry from the interport control bus;
wherein the control circuitry of each of the ports is configured to selectively respond to commands received from either an external device or the interport control bus.

18. A memory, comprising:
two or more ports, each port comprising one or more regions of memory, control circuitry for controlling access to the one or more regions of memory in response to commands, and an internal data bus for communicating data values from the one or more regions of memory to an external device and for communicating data values from an external device to the one or more regions of memory, wherein the control circuitry of each port of the two or more ports is separate from the control circuitry of the other ports of the two or more ports; and
an interport control bus that is different from the internal data bus of each of the two or more ports coupled between the control circuitry of at least one pair of ports;
wherein the control circuitry of each of the ports is configured to receive commands from an external device or from an interport control bus;
wherein the control circuitry of at least one port of the at least one pair of ports is configured to forward a command received from an external control bus to the control circuitry of the other port of the at least one pair of pair of ports through the interport control bus coupled between the control circuitry of the at least one pair of ports; and
wherein the control circuitry of the other port of the at least one pair of pair of ports is configured to selectively respond to either the command forwarded to the control circuitry of the other port of the at least one pair of pair of ports through the interport control bus coupled between the control circuitry of the at least one pair of ports or a command received at the control circuitry of the other port of the at least one pair of pair of ports from another external control bus.

19. The memory of claim 18, wherein the control circuitry of the at least one port of the at least one pair of ports configured to forward the command received from the external control bus to the control circuitry of the other port of the at least one pair of ports is further configured to respond to commands received from that external control bus.

20. A memory, comprising:
two or more ports, each port comprising one or more regions of memory, control circuitry for controlling access to the one or more regions of memory in response to commands, and an internal data bus for communicating data values from the one or more regions of memory to an external device and for communicating data values from an external device to the one or more regions of memory, wherein the control circuitry of each port of the two or more ports is separate from the control circuitry of the other ports of the two or more ports; and
an interport control bus coupled between the control circuitry of each pair of ports, the interport control bus being different from the internal data bus of each of the two or more ports;
wherein the control circuitry of each of the ports is configured to receive commands from an external device or from an interport control bus;
wherein the control circuitry of at least one port of at least one pair of ports is configured to forward a command received from an external device to the control circuitry of the other port of the at least one pair of pair of ports through the interport control bus coupled between the control circuitry of the at least one pair of ports;
wherein the control circuitry of at least one of the ports is configured to selectively respond to either commands received from an interport control bus coupled to that control circuitry or to commands from the external device; and
wherein the control circuitry of at least one of the ports is further configured to selectively isolate that control circuitry from an interport control bus coupled to that control circuitry.

21. The memory of claim 20, wherein control circuitry configured to respond to commands received from an interport control bus coupled to that control circuitry comprises control circuitry configured to respond to commands received from only one interport control bus coupled to that control circuitry.

22. A memory, comprising:
two or more ports, each port comprising one or more regions of memory, control circuitry for controlling access to the one or more regions of memory in response to commands, and an internal data bus for communicating data values to and from the one or more regions of memory, wherein the control circuitry of each port of the two or more ports is separate from the control circuitry of the other ports of the two or more ports; and
an interport control bus that is different from the internal data bus of each of the two or more ports for communicating commands between the control circuitry of each of the two of more of the ports;
wherein the control circuitry of each of the ports is configured to receive commands from an external device or from the interport control bus;
wherein the control circuitry of one of the ports is configured to forward a command received from an external control bus to the control circuitry of at least one other of the ports through the interport control bus; and
wherein the control circuitry of the at least one other of the ports is configured to selectively respond to either the command forwarded to the control circuitry of the at least one other of the ports through the interport control bus or a command received from another external control bus.

23. The memory of claim 22, wherein the control circuitry configured to forward the command received from the external control bus to the control circuitry of the at least one other of the ports is further configured to respond to that command.

24. A memory, comprising:
two or more ports, each port comprising one or more regions of memory, control circuitry for controlling access to the one or more regions of memory in response to commands, and an internal data bus for communicating data values to and from the one or more regions of memory, wherein the control circuitry of each port of the two or more ports is separate from the control circuitry of the other ports of the two or more ports; and
an interport control bus that is different from the internal data bus of each of the two or more ports for communicating commands between the control circuitry of each of the two of more of the ports;
wherein the control circuitry of each of the ports is configured to receive commands from an external device or from the interport control bus;
wherein the control circuitry of one of the ports is configured to forward a command received from an external control bus to the control circuitry of at least one other of the ports through the interport control bus;
wherein the control circuitry of at least one of the ports is configured to selectively respond to either commands received from the interport control bus or the external device; and
wherein the control circuitry of at least one of the ports is further configured to selectively isolate that control circuitry from the interport control bus.

25. A memory, comprising:
two or more ports, each port comprising one or more regions of memory, control circuitry for controlling access to the one or more regions of memory in response to commands, and an internal data bus for communicating data values to and from the one or more regions of memory, wherein the control circuitry of each port of the two or more ports is separate from the control circuitry of the other ports of the two or more ports; and
an interport control bus that is different from the internal data bus of each of the two or more ports for communicating commands between the control circuitry of each of the two of more of the ports;
wherein the control circuitry of each of the ports is configured to receive commands from an external device or from the interport control bus;
wherein the control circuitry of one of the ports is configured to forward a command received from an external control bus to the control circuitry of at least one other of the ports through the interport control bus;
wherein the control circuitry of at least one of the ports is configured to selectively respond to either commands received from the interport control bus or the external device; and
wherein the control circuitry of each of the ports is configured to selectively isolate itself from the interport control bus.

26. The memory of claim 25, wherein the control circuitry of at least one of the ports is configured to respond to commands received from an external device without passing those commands to the interport control bus.

27. A memory, comprising:
two or more ports, each port comprising one or more regions of memory, control circuitry for controlling access to the one or more regions of memory in response to commands, and an internal data bus for communicating data values to and from the one or more regions of memory, wherein the control circuitry of each port of the two or more ports is separate from the control circuitry of the other ports of the two or more ports; and
an interport control bus for communicating commands between the control circuitry of each of the two of more of the ports;
wherein the control circuitry of each of the ports is configured to receive commands from an external device or from the interport control bus;
wherein the control circuitry of one of the ports is configured to forward a command received from an external control bus to the control circuitry of at least one other of the ports through the interport control bus;
wherein the control circuitry of at least one of the ports is configured to respond to commands received from the interport control bus;
wherein the control circuitry of each of the ports is configured to selectively isolate itself from the interport control bus; and
wherein the control circuitry of each of the ports is configured to selectively isolate itself from the interport control bus using a switch coupled between itself and the interport control bus.

28. An electronic system, comprising:
at least one memory, the at least one memory comprising:
two or more ports, each port comprising one or more regions of memory and control circuitry for controlling access to the one or more regions of memory in response to commands; and
at least one interport control bus for communicating commands between the control circuitry of two of more of the ports;
wherein the control circuitry of a first port of the two or more ports is configured to select whether to respond to commands received from either a first external control bus that is different than the at least one interport control bus or the at least one interport control bus; and
wherein the control circuitry of a second port of the two or more ports is configured to select whether to respond to commands received from either a second external control bus that is different than the at least one interport control bus and the first external control bus or the at least one interport control bus;
a processor coupled to the at least one memory;
wherein the processor is configured to provide commands to at least one of the ports of each at least one memory; and
wherein the processor is configured to send data to, and receive data from, each of the ports of each at least one memory.

29. A method of controlling a multi-port memory having two or more ports, with each port having one or more regions of memory and control circuitry for controlling access to the one or more regions of memory, the method comprising:
receiving a first command from an external bus at the control circuitry of a first port of the multi-port memory;
forwarding the first command from the control circuitry of the first port to the control circuitry of one or more additional ports of the multi-port memory through an interport control bus coupled between the control circuitry of the first port and the control circuitry of the one or more additional ports, wherein the control circuitry of each of the one or more additional ports is separate from the first port;

using the control circuitry of the one or more additional ports to select whether the control circuitry of the one or more additional ports will respond to the first command forwarded from the control circuitry of the first port through the interport control bus or to a second command received from another external bus, that is different than the interport control bus, at the one or more additional ports; and processing the first command at the control circuitry of the first port and processing the first command at the control circuitry of the one or more additional ports, when the control circuitry of the one or more additional ports selects to respond to the first command forwarded from the control circuitry of the first port through the interport control bus, to concurrently access regions of memory of the first port and the one or more additional ports.

30. The method of claim 29, wherein receiving a first command comprises receiving a read command or a write command.

31. The method of claim 30, wherein receiving the first command further comprises receiving an address associated with the first command.

32. The method of claim 31, wherein processing the first command further comprises ignoring the first command at the control circuitry of a particular port if the address associated with the first command does not match an address of a region of memory of the particular port.

33. The method of claim 29, wherein forwarding the first command further comprises cascading the first command from the control circuitry of one port to the control circuitry of successive ports.

34. The method of claim 29, wherein forwarding the first command further comprises forwarding the first command to the control circuitry of each remaining port.

35. A method of controlling a multi-port memory having a plurality of ports, with each port of the plurality of ports having one or more regions of memory and control circuitry for controlling access to the one or more regions of memory, the method comprising:

receiving a first command at the control circuitry of a first port of the plurality of ports;

forwarding the first command from the control circuitry of the first port to the control circuitry of one or more additional ports of the plurality of ports, wherein the control circuitry of each of the one or more additional ports is separate from the first port;

using the control circuitry of the one or more additional ports to select whether the control circuitry of the one or more additional ports will respond to the first command forwarded from the control circuitry of the first port or to a second command received from an external bus at the one or more additional ports;

processing the first command at the control circuitry of the first port and at the control circuitry of any of the one or more additional ports whose control circuitry selects to respond to the first command forwarded from the control circuitry of the first port to concurrently access regions of memory of the first port and the one or more additional ports whose control circuitry selects to respond to the first command forwarded from the control circuitry of the first port; and isolating the control circuitry of at least one other port of the plurality of ports from the first command.

36. The method of claim 35, further comprising processing the second command at the control circuitry of any of the one or more additional ports whose control circuitry selects to respond to the second command.

* * * * *

UNITED STATES PATENT AND TRADEMARK OFFICE
CERTIFICATE OF CORRECTION

PATENT NO. : 8,769,213 B2  Page 1 of 2
APPLICATION NO. : 12/546258
DATED : July 1, 2014
INVENTOR(S) : Dan Skinner and J. Thomas Pawlowski It is certified that error appears in the above-identified patent and that said Letters Patent is hereby corrected as shown below:

In the Claims:

Column 9, lines 12-13, delete "two of more of the ports" and insert in place thereof --the two or more ports--.

Column 9, lines 37-38, delete "two of more of the ports" and insert in place thereof --the two or more ports--.

Column 9, lines 55-56, delete "two of more of the ports" and insert in place thereof --the two or more ports--.

Column 10, lines 2-3, delete "two of more of the ports" and insert in place thereof --the two or more ports--.

Column 11, lines 51-52, delete "pair of pair of" and insert in place thereof --pair of--.

Column 11, line 56, delete "pair of pair of" and insert in place thereof --pair of--.

Column 11, lines 58-59, delete "pair of pair of" and insert in place thereof --pair of--.

Column 11, line 62, delete "pair of pair of" and insert in place thereof --pair of--.

Column 12, line 24, delete "pair of pair of" and insert in place thereof --pair of--.

Column 12, line 54, delete "two of more of the ports" and insert in place thereof --two or more ports--.

Column 13, line 17, delete "two of more of the ports" and insert in place thereof --two or more ports--.

Column 13, line 44, delete "two of more of the ports" and insert in place thereof --two or more ports--.

Signed and Sealed this
Second Day of August, 2016

Michelle K. Lee
*Director of the United States Patent and Trademark Office*

Column 14, lines 6-7, delete "two of more of the ports" and insert in place thereof --two or more ports--.

Column 14, lines 33-34, delete "two of more of the ports" and insert in place thereof --the two or more ports--.